(12) United States Patent
Nishi

(10) Patent No.: US 9,123,792 B2
(45) Date of Patent: Sep. 1, 2015

(54) SEMICONDUCTOR DEVICE AND METHOD FOR MANUFACTURING THE SAME

(71) Applicant: Sumitomo Electric Device Innovations, Inc., Yokohama (JP)

(72) Inventor: Masahiro Nishi, Yokohama (JP)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 0 days.

(21) Appl. No.: 14/226,454

(22) Filed: Mar. 26, 2014

(65) Prior Publication Data

US 2014/0291774 A1 Oct. 2, 2014

(30) Foreign Application Priority Data

Mar. 29, 2013 (JP) ................................. 2013-074629

(51) Int. Cl.

| | |
|---|---|
| *H01L 29/778* | (2006.01) |
| *H01L 29/423* | (2006.01) |
| *H01L 21/285* | (2006.01) |
| *H01L 29/47* | (2006.01) |
| *H01L 29/20* | (2006.01) |

(52) U.S. Cl.
CPC ...... *H01L 29/7787* (2013.01); *H01L 21/28587* (2013.01); *H01L 29/42316* (2013.01); *H01L 29/2003* (2013.01); *H01L 29/475* (2013.01)

(58) Field of Classification Search
CPC ...................... H01L 29/42316; H01L 29/7787; H01L 29/2003; H01L 29/475; H01L 29/778; H01L 29/7781; H01L 29/7782; H01L 29/7786
See application file for complete search history.

(56) References Cited

U.S. PATENT DOCUMENTS

| | | | | |
|---|---|---|---|---|
| 7,387,955 | B2* | 6/2008 | Ahn et al. ...................... | 438/574 |
| 7,432,563 | B2* | 10/2008 | Behammer ..................... | 257/401 |
| 2002/0187623 | A1* | 12/2002 | Oikawa et al. ................ | 438/590 |
| 2005/0147923 | A1* | 7/2005 | Sawada .......................... | 430/314 |
| 2007/0264781 | A1* | 11/2007 | Behammer ..................... | 438/270 |
| 2007/0267655 | A1* | 11/2007 | Endoh et al. .................. | 257/194 |
| 2009/0085063 | A1* | 4/2009 | Makiyama et al. ............ | 257/192 |
| 2010/0155741 | A1* | 6/2010 | Ohki et al. ....................... | 257/76 |
| 2011/0057272 | A1* | 3/2011 | Kurahashi et al. ............. | 257/410 |
| 2012/0021597 | A1* | 1/2012 | Araya et al. ................... | 438/606 |
| 2013/0082307 | A1* | 4/2013 | Okamoto et al. .............. | 257/279 |
| 2013/0082400 | A1* | 4/2013 | Ohki et al. ...................... | 257/774 |
| 2014/0159050 | A1* | 6/2014 | Yoon et al. ....................... | 257/76 |

FOREIGN PATENT DOCUMENTS

JP 2005-302916 10/2005

* cited by examiner

*Primary Examiner* — Jarrett Stark
*Assistant Examiner* — Bitew Dinke
(74) *Attorney, Agent, or Firm* — Venable LLP; Michael A. Sartori

(57) ABSTRACT

A semiconductor device includes: a nitride semiconductor layer; a first silicon nitride film that is formed on the nitride semiconductor layer, has a first opening whose inner wall is a forward tapered shape; a second silicon nitride film that is formed on the first silicon nitride film, and has a second opening whose inner wall is an inverse tapered shape; and a gate electrode formed so as to cover the whole surface of the nitride semiconductor layer exposed on the inside of the first opening; wherein a side wall of the gate electrode separates from the first silicon nitride film and the second silicon nitride film via a cavity.

19 Claims, 10 Drawing Sheets

(FIRST EMBODIMENT)

(FIRST COMPARATIVE EXAMPLE)

(SECOND COMPARATIVE EXAMPLE)

SEMICONDUCTOR DEVICE AND METHOD FOR MANUFACTURING THE SAME

CROSS-REFERENCE TO RELATED APPLICATION

This application is based upon and claims the benefit of priority of the prior Japanese Patent Application No. 2013-074629 filed on Mar. 29, 2013, the entire contents of which are incorporated herein by reference.

BACKGROUND (i) Technical Field

A certain aspect of the embodiments discussed herein is related to a semiconductor device using a nitride semiconductor and a method for manufacturing the same.

(ii) Related Art

The semiconductor device using the nitride semiconductor is used for a power element which operates in high frequency and high output. There is known a field effect transistor (FET) such as a high electron mobility transistor (HEMT), as a semiconductor device which is suitable for amplification in a high frequency band such as a microwave, a submillimeter wave, a millimeter wave and so on, especially.

Japanese Patent Application Publication No. 2005-302916 discloses a field effect transistor in which a gate electrode and ohmic electrodes (a source electrode and a drain electrode) were formed on a nitride semiconductor layer.

SUMMARY

It is an object to provide a semiconductor device and a method for manufacturing the semiconductor device that can control decrease of characteristic and reliability.

According to an aspect of the present invention, there is provided a semiconductor device, including: a nitride semiconductor layer; a first silicon nitride film that is formed on the nitride semiconductor layer, has a first opening whose inner wall is a forward tapered shape; a second silicon nitride film that is formed on the first silicon nitride film, and has a second opening whose inner wall is an inverse tapered shape; and a gate electrode formed so as to cover the whole surface of the nitride semiconductor layer exposed on the inside of the first opening; wherein a side wall of the gate electrode separates from a boundary between the first silicon nitride film and the second silicon nitride film via a cavity.

According to another aspect of the present invention, there is provided a method for manufacturing a semiconductor device, including: forming a first silicon nitride film on a nitride semiconductor layer; forming a second silicon nitride film on the first silicon nitride film having an etching rate larger than that of the first silicon nitride film; etching the first silicon nitride film and the second silicon nitride film, and forming a first opening and a second opening on the first silicon nitride film and the second silicon nitride film, respectively; forming a gate electrode in the first opening and the second opening formed on the nitride semiconductor layer; wherein in the forming the gate electrode, the gate electrode covers the whole surface of the nitride semiconductor layer exposed on the inside of the first opening, and is formed so that a side wall of the gate electrode separates from a boundary between the first silicon nitride film and the second silicon nitride film via a cavity.

DETAILED DESCRIPTION

In a transistor (HEMT etc.) using the nitride semiconductor, generally, an opening is formed on a silicon nitride (SiN) film provided on a nitride semiconductor layer, and a gate electrode in contact with the nitride semiconductor layer is formed from the opening. At this time, there is a case where the gate electrode contacts a side wall of the silicon nitride film, a capacity is given around a contact domain and hence the characteristic of the transistor is changed. When gold (Au) is used as the gate electrode, an AuSi eutectic crystal is generated by the contact of the gate electrode and the silicon nitride, and hence there is a problem that reliability decreases. Since coefficients of thermal expansion of the gate electrode and the silicon nitride film are different from each other, there is a case where a large stress is added near the gate by the contact of the gate electrode and the silicon nitride and the characteristic of the transistor is changed.

First Embodiment

Figure 1A:
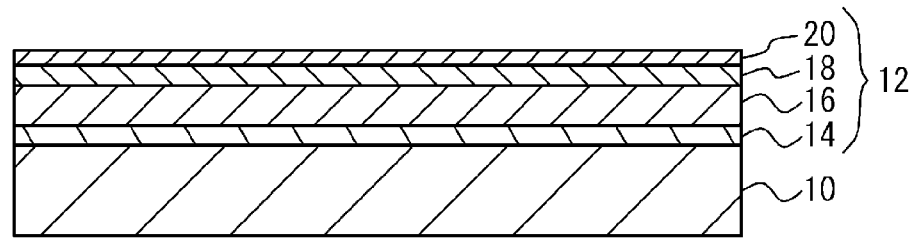
FIGS. 1A to 1E are diagrams illustrating a method for manufacturing a semiconductor device according to a first embodiment (part 1)

FIGS. 1A to 2D are schematic cross-section diagrams illustrating a method for manufacturing a semiconductor device according to a first embodiment. First, a nitride semiconductor layer 12 is formed on a substrate 10, as illustrated in FIG. 1A. A SiC substrate having a (0001) principal surface, for example, can be used as the substrate 10. A nuclear formation layer 14, an electronic transit layer 16, an electron supply layer 18, and a cap layer 20 are laminated in order, and hence the nitride semiconductor layer 12 is formed. Aluminium nitride (AlN) having a thickness of 300 nm for example, can be used for the nuclear formation layer 14. Non-doped gallium nitride (GaN) having a thickness of 1000 nm for example, can be used for the electronic transit layer 16. N-type aluminium nitride gallium (AlGaN) having a thickness of 20 nm for example, can be used for the electron supply layer 18. N-type gallium nitride (GaN) having a thickness of 5 nm for example, can be used for the cap layer 20. In the following process drawings, the above-mentioned laminated bodies are united and illustrated as the nitride semiconductor layer 12, and the illustration of each layer is omitted.

Figure 1B:
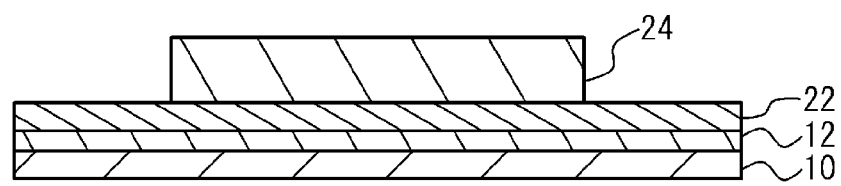

Next, a first silicon nitride film 22 (SiN) is formed on the nitride semiconductor layer 12, as illustrated in FIG. 1B. The first silicon nitride film 22 can be formed, for example by a CVD (Chemical Vapor Deposition) method, and the thickness thereof can be set to 20 nm. Then, a first resist 24 is formed on the first silicon nitride film 22, and patterning is performed according to the form of ohmic electrodes (i.e., a source electrode and a drain electrode). A photoresist is used for the first resist 24, and the patterning can be performed by exposure.

Figure 1C:
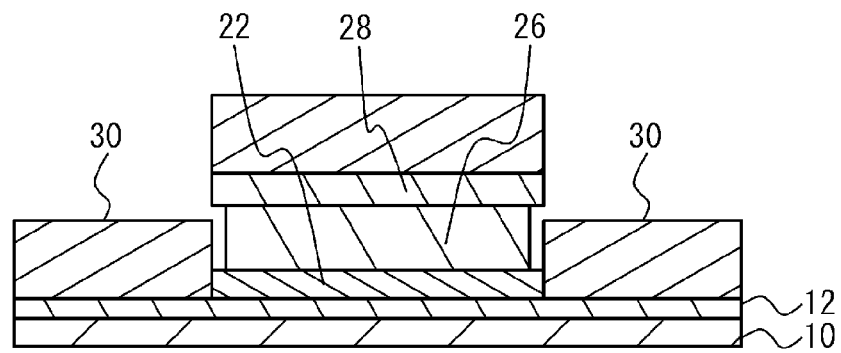

Next, the first silicon nitride film 22 is etched by using the first resist 24 as the mask, and the nitride semiconductor layer 12 is exposed, as illustrated in FIG. 1C. Then, liftoff of the first resist 24 is performed, and a second resist 26 and a third resist 28 are anew formed and patterned on the nitride semiconductor layer 12. At this time, an upper surface of the second resist 26 is arranged above a formation position of ohmic electrodes 30. The outer peripheral portion of the third resist 28 protrudes from the peripheral portion of the second resist 26. Then, the ohmic electrodes 30 are formed on the nitride semiconductor layer 12 by using the second resist 26 and the third resist 28 as the mask. One of the formed ohmic electrodes 30 becomes the source electrode, and another one becomes the drain electrode. A metal layer in which aluminum (Al) having a thickness of 300 nm is laminated on titanium (Ti) having a thickness of 10 nm can be used for the ohmic electrodes 30, for example. Moreover, instead of the above-mentioned titanium, tantalum (Ta) having a thickness of 10 nm may be used. The ohmic electrodes 30 can be formed with an evaporation method, for example.

Figure 1D:
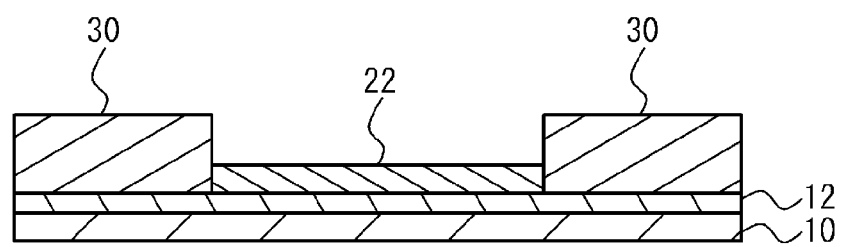
Figure 1E:
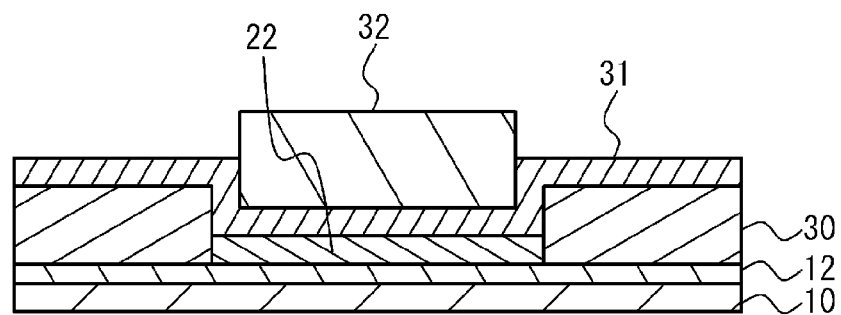

Next, as illustrated in FIG. 1D, liftoff of the second resist 26 and the third resist 28 is performed. Next, as illustrated in FIG. 1E, the second silicon nitride film 31 (SiN) is formed on the first silicon nitride film 22 and the ohmic electrodes 30. The second silicon nitride film 31 can be formed by the CVD (Chemical Vapor Deposition) method, for example, and the thickness thereof can be set to 40 nm. Then, a fourth resist 32 is formed on the second silicon nitride film 31, and patterning is performed so that the fourth resist 32 remains in an opening between the ohmic electrodes 30.

Here, a silicon nitride film having a large etching rate compared with the first silicon nitride film 22 is used for the second silicon nitride film 31. In the present embodiment, a low dense film is used for the second silicon nitride film 31 compared with the first silicon nitride film 22. In order to realize this, there is a method which makes the first silicon nitride film 22 high-dense by performing heat treatment (i.e., annealing) to the first silicon nitride film 22 after formation of the first silicon nitride film 22, for example. The temperature of the annealing can be 500° C., for example, and in the present embodiment, the first silicon nitride film 22 and the ohmic electrodes 30 are simultaneously annealed. Here, the annealing processes of the first silicon nitride film 22 and the ohmic electrodes 30 may be performed separately. It is desirable that the temperature of the annealing is within the range of 300 to 700° C., and it is more desirable that the temperature of the annealing is within the range of 400 to 600° C. According to the above-mentioned annealing processes, the etching rate of the first silicon nitride film 22 can be made small compared with the etching rate of the second silicon nitride film 31.

Figure 2A:
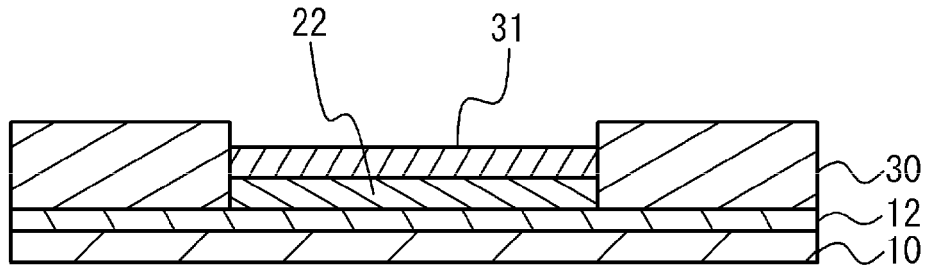
FIGS. 2A to 2D are diagrams illustrating the method for manufacturing the semiconductor device according to the first embodiment (part 2)
Figure 2B:
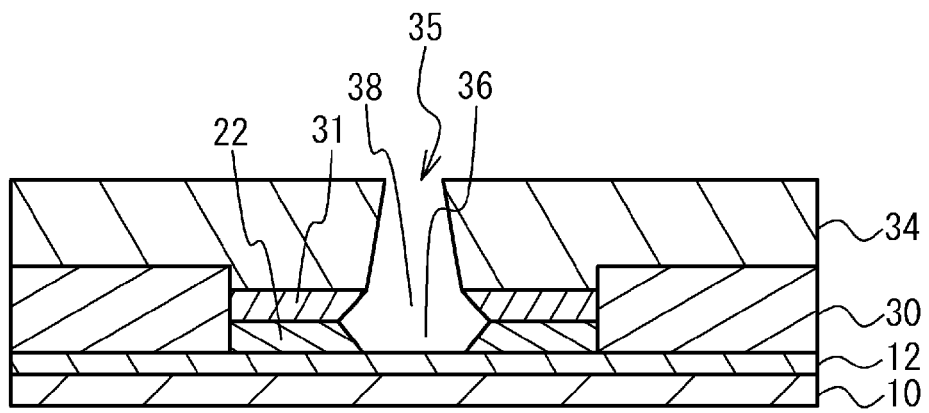

Next, the second silicon nitride film 31 is etched by using the fourth resist 32 as the mask, as illustrated in FIG. 2A. At this time, the etching is performed so that the second silicon nitride film 31 is extended on the first silicon nitride film 22 placed on the opening between the ohmic electrodes 30. After completion of the etching, the fourth resist 32 is exfoliated.

Next, a fifth resist 34 is formed on the second silicon nitride film 31 and the ohmic electrodes 30, and the opening 35 is formed so as to be aligned with the formation position of a gate electrode (i.e., patterning is performed). At this time, in order to form an inverse taper-shaped opening easily in the second silicon nitride film 31 in the process described below, it is desirable to make the shape of the opening 35 into a taper shape which spreads from a surface side toward an opposite side (a side of the substrate 10).

Then, the second silicon nitride film 31 and the first silicon nitride film 22 are etched by using the fifth resist 34 as the mask, and the nitride semiconductor layer 12 is exposed. A dry etching by a reactive ion etching (RIE) system or an inductively coupled plasma (ICP) system can be employed as the etching process, for example. Specifically, at least one of $SF_6$, $CHF_3$, and $CH_4$ can be used as etching gas.

By the above-mentioned process, a first opening 36 and a second opening 38 are formed in the first silicon nitride film 22 and the second silicon nitride film 31, respectively, according to respective etching rates. At this time, since the first silicon nitride film 22 is the high dense film, the first opening 36 becomes a taper shape (hereinafter referred to as "a forward tapered shape") which spreads from a side of the nitride semiconductor layer 12 toward an opposite side. On the other hand, since the second silicon nitride film 31 is the low dense film, a lower domain is etched greatly and the second opening 38 becomes a taper shape (hereinafter referred to as "an inverse tapered shape") which narrows from the side of the nitride semiconductor layer 12 toward the opposite side. As long as the etching process is performed on the condition that the second silicon nitride film 31 becomes the inverse tapered shape, a method other than the above-mentioned method may be used.

Figure 2C:
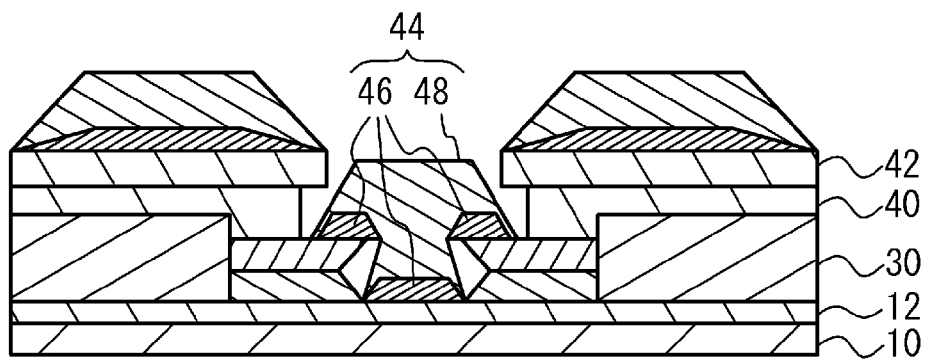

Next, the fifth resist 34 is exfoliated, as illustrated in FIG. 2C. Then, a sixth resist 40 and a seventh resist 42 are formed on the second silicon nitride film 31 and the ohmic electrodes 30. The patterning is performed so as to be aligned with the formation position of the gate electrode. At this time an opening of the seventh resist 42 (an upper layer) is made smaller than an opening of the sixth resist 40 (a lower layer). Then, a gate electrode 44 is formed by using the sixth resist 40 and the seventh resist 42 as the mask. A second metal layer 48 having a low resistance is laminated on a first metal layer 46 which has a high resistance and becomes a base, so that the gate electrode 44 is formed. For example, nickel (Ni) and palladium (Pd) formed thereon can be used for the first metal layer 46, and the thickness of the first metal layer 46 can be 50 nm. Gold (Au) having a thickness of 400 nm can be used for the second metal layer 48, for example.

Figure 2D:
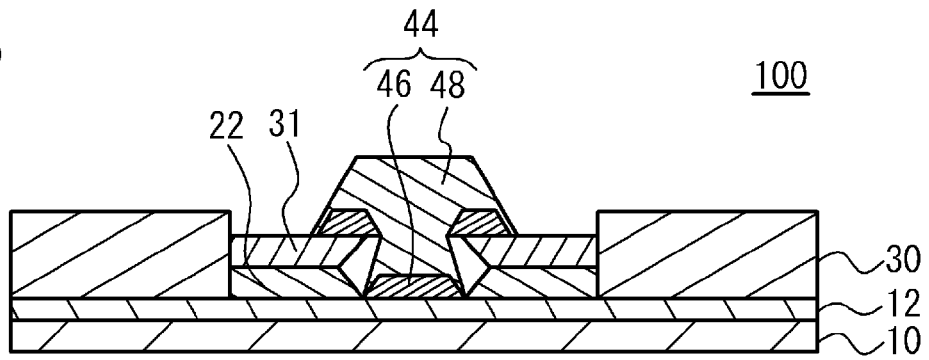

Next, the liftoff of the sixth resist 40 and the seventh resist 42 is performed, as illustrated in FIG. 2D. According to the above processes, a semiconductor device 100 according to the first embodiment is completed. In the semiconductor device 100, the nitride semiconductor layer 12 is formed on the substrate 10, and the ohmic electrodes 30 which are the source electrode and the drain electrode are directly formed on the nitride semiconductor layer 12. The silicon nitride films (i.e., the first silicon nitride film 22 and the second silicon nitride film 31) of two layers are formed in the opening between the ohmic electrodes 30. The gate electrode 44 is formed in the openings (i.e., the first opening 36 and the second opening 38) formed on the silicon nitride films. The gate electrode 44 comes in contact with the nitride semiconductor layer 12, and is formed so as to reach the surface of the second silicon nitride film 31 through the above-mentioned openings. In the present embodiment, the surface of the gate electrode 44 projects from the surface of the second silicon nitride film 31 and becomes a convex shape.

Next, an effect peculiar to the semiconductor device according to the first embodiment is explained using FIG. 3.

Figure 3A:
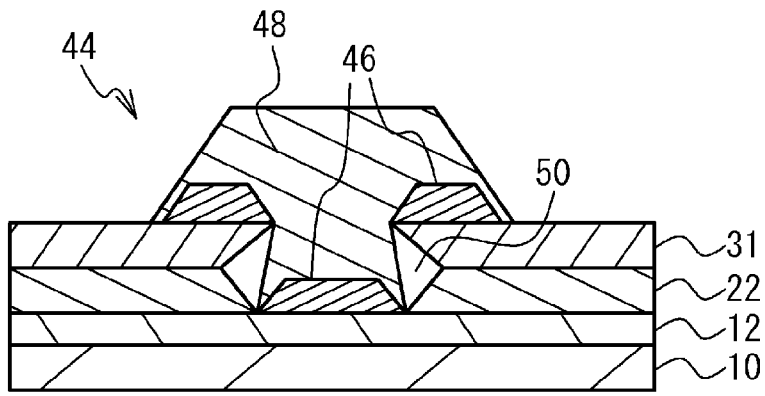
FIG. 3A is a diagram illustrating the configuration of the semiconductor device according to the first embodiment.
Figure 3B:
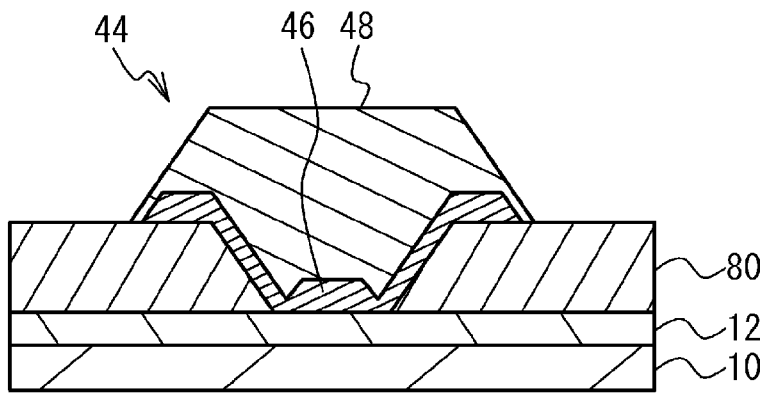
FIG. 3B is a diagram illustrating the configuration of the semiconductor device according to a first comparative example.
Figure 3C:
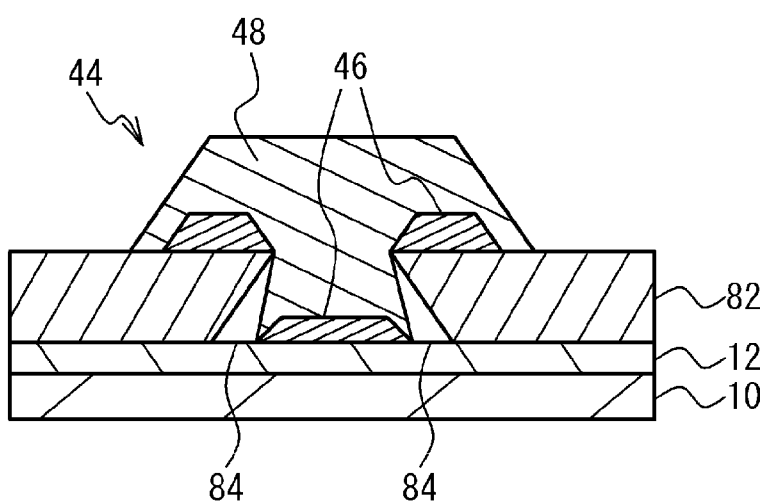
FIG. 3C is a diagram illustrating the configuration of the semiconductor device according to a second comparative example.

FIG. 3A is a schematic cross-section diagram illustrating the detailed configuration of the gate electrode in the semiconductor device according to the first embodiment. FIG. 3B is a diagram illustrating the configuration of the semiconductor device according to a first comparative example. FIG. 3C is a diagram illustrating the configuration of the semiconductor device according to a second comparative example. In FIGS. 3A to 3C, the configurations of the substrate 10, the nitride semiconductor layer 12, and the ohmic electrodes 30 are common to each other, and the configurations of the silicon nitride film and the gate electrode are different from each other.

In the first comparative example, a silicon nitride film 80 is a single layer, and the shape of the opening becomes the forward tapered shape which spreads from the side of the nitride semiconductor layer 12 toward the opposite side thereof, as illustrated in FIG. 3B. Therefore, the first metal layer 46 of the gate electrode 44 adheres to a side wall of the opening in the silicon nitride film 80, and the first metal layer 46 on the nitride semiconductor layer 12 and the first metal layer 46 on silicon nitride film 80 are connected to each other. As a result, a parasitic capacitance may adhere by the first metal layer 46 of a high resistance which adheres to the silicon nitride film 80 and hence the characteristic of the HEMT may change. In addition, an AuSi eutectic may be generated between the silicon nitride film 80 and the gold (Au) used for the second metal layer 48, and hence reliability may decrease. Moreover, the coefficients of thermal expansion of the gate electrode 44 and the silicon nitride film 80 are different from each other. Therefore, when both of them mutually contact, a large stress may be added near the gate electrode and the characteristic of the HEMT may change.

In the second comparative example, a silicon nitride film 82 is a single layer, and the shape of the opening becomes the inverse tapered shape which narrows from the side of the nitride semiconductor layer 12 toward the opposite side thereof, as illustrated in FIG. 3C. In the present configuration, the adhesion of the first metal layers 46 to the side wall of the silicon nitride film 82 can be controlled, but the first metal layer 46 cannot cover the whole surface of the nitride semiconductor layer 12 and a part of the surface of the nitride semiconductor layer 12 is exposed (see a code 84).

On the contrary, in the semiconductor device 100 according to the first embodiment illustrated in FIG. 3A, the silicon nitride film has a two-layer structure (i.e., the first silicon nitride film 22 and the second silicon nitride film 31). Then, the opening (i.e., the first opening 36) of a lower layer (i.e., the first silicon nitride film 22) becomes the forward tapered shape which spreads from the side of the nitride semiconductor layer 12 toward the opposite side thereof. The opening (i.e., the second opening 38) of an upper layer (i.e., the second silicon nitride film 31) becomes the inverse tapered shape which narrows from the side of the nitride semiconductor layer 12 toward the opposite side thereof. In each of the first opening 36 and the second opening 38, the gate electrode 44 separates from the side walls of the first silicon nitride film 22 and the second silicon nitride film 31 via cavities 50. That is, the side walls of the gate electrode 44 are configured to separate from a boundary between a surface (i.e., an upper surface) of the first silicon nitride film 22 in the side of the second silicon nitride film 31 and a surface (i.e., a lower surface) of the second silicon nitride film 31 in the side of the first silicon nitride film 22 via the cavities 50. Therefore, compared with the first comparative example, the adhesion of the gate electrode (i.e., a base layer) to the side wall of the silicon nitride film is controlled, and the above-mentioned harmful effect by the adhesion can be controlled. As a result, the characteristic and the reliability of the HEMT can be improved.

Moreover, according to the semiconductor device 100 of the first embodiment, the first metal layer 46 on the nitride semiconductor layer 12 is separated from the first metal layers 46 on the second silicon nitride film 31. Thereby, the second metal layer 48 having the low resistance is controlled not to become the high resistance by a reaction with the first metal layers 46 having the high resistance, and the decrease of the characteristic and the reliability of the HEMT can be controlled more effectively. Adhesiveness between each of the first metal layers 46 and the second silicon nitride film 31 is greater than adhesiveness between the second metal layer 48 and the second silicon nitride film 31.

Moreover, according to the semiconductor device 100 of the first embodiment, the shape of the first opening 36 becomes the forward tapered shape as viewed from above (i.e., the side opposite to the nitride semiconductor layer 12), and hence the gate electrode 44 (i.e., the first metal layer 46) can be formed so as to cover the surface of the nitride semiconductor layer 12. That is, the gate electrode 44 is formed in contact with an inner wall of a lower side of the first silicon nitride film 22. Therefore, the decrease of the reliability by the exposure of the nitride semiconductor layer 12 can be controlled, compared with the comparative example 2.

As described above, according to the semiconductor device 100 of the first embodiment, the decrease of the characteristic and the reliability of the HEMT can be controlled. Here, in the present embodiment, description is given of an example in which the gate electrode 44 does not come in contact with the side walls of the first silicon nitride film 22 and the second silicon nitride film 31. However, when there is a separation portion between the gate electrode and the side walls even if the gate electrode comes in contact with a part of the side walls, the change of the characteristic and the decrease of the reliability by the contact of the gate electrode and the side walls can be controlled by just that much.

In the semiconductor device 100 of the first embodiment, the high dense film is used for the first silicon nitride film 22, the low dense film is used for the second silicon nitride film 31, and those films are etched by the dry etching. Thereby, the first opening 36 of the first silicon nitride film 22 can be made into the forward tapered shape, and the second opening 38 of the second silicon nitride film 31 can be made into the inverse tapered shape. In order to make the second silicon nitride film 31 into the inverse tapered shape, it is effective to use the etching gas, such as $SF_6$, $CHF_3$, and $CH_4$, as described above. When gas containing HF like $CHF_3$ is used, the deposit of CF to the second silicon nitride film 31 is increased by increasing gas pressure, and hence the inverse tapered shape can be made easy to form. Moreover, when the length of the gate electrode is short and the length of the opening is small, the etching of the inverse tapered shape can be performed using only $SF_6$. Here, in the first embodiment, the thickness of the first silicon nitride film 22 is 20 nm and the thickness of the second silicon nitride film 31 is 40 nm, but these can be arbitrarily changed in the range of 10 to 100 nm.

Figure 4:
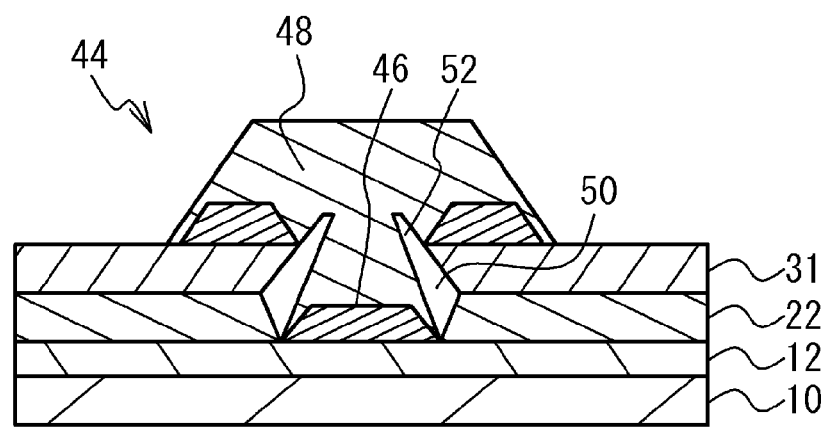
FIG. 4 is a diagram illustrating the configuration of the semiconductor device according to a variation example of the first embodiment.

FIG. 4 is a diagram illustrating the configuration of the semiconductor device according to a variation example of the first embodiment. Elements corresponding to those of the first embodiment are denoted by the same reference numerals, and description thereof is omitted. In the present variation example, the cavities 50 between the gate electrode 44 and the silicon nitride films (22 and 31) project above the second silicon nitride film 31 (here, the projection portions are referred to as cavities 52), as illustrated in FIG. 4. Thereby, parts of the first metal layers 46 on the second silicon nitride film 31 are configured so as to separate from the second metal layer 48 via the cavities 52 continuous with the cavities 50. According to the configuration, the stress between the gate electrode 44 and the silicon nitride films (22 and 31) can be reduced by existence of the cavities 52, and hence the decrease of the characteristic and the reliability of the HEMT can further be controlled.

In this configuration, the etching using ICP (Inductively Coupled Plasma) when the first silicon nitride film 22 and the second silicon nitride film 31 are etched (see FIG. 2B) and the nitride semiconductor layer 12 is exposed can be performed on the following conditions: $SF_6:CHF_3=40:5$ sccm, pressure=1 Pa, power=100 W, and bias=10 W.

Second Embodiment

A second embodiment indicates an example in which an insulating film having a three-layer structure is used instead of the silicon nitride film having the two-layer structure.

FIGS. 5A to 5D are schematic cross-section diagrams illustrating a method for manufacturing the semiconductor device according to the second embodiment. Elements corresponding to those of the first embodiment are denoted by the same reference numerals, and description thereof is omitted.

Figure 5A:
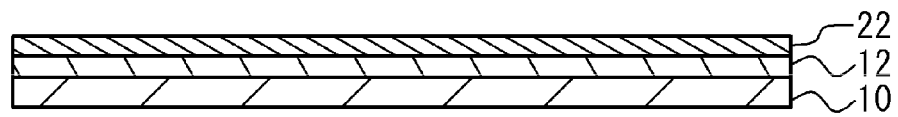
FIGS. 5A to 5D are diagrams illustrating a method for manufacturing the semiconductor device according to a second embodiment (part 1)
Figure 5B:
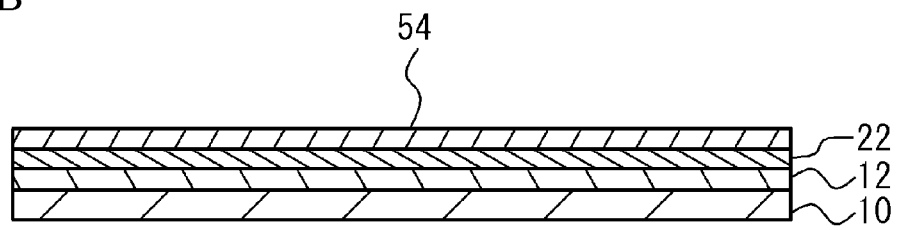

First, the nitride semiconductor layer 12 is formed on the substrate 10, and the first silicon nitride film 22 is formed thereon, as illustrated in FIG. 5A. Next, an insulating film 54 is formed on the first silicon nitride film 22, as illustrated in FIG. 5B. It is assumed that the insulating film 54 is a film having a low density and a low refractive index, compared with the first silicon nitride film 22 and a second silicon nitride film 33 as described later. A silicon nitride (SiN) film having a thickness of 40 nm can be used for the insulating film 54, for example, and a silicon oxide ($SiO_2$) film can be also used other than this.

Figure 5C:
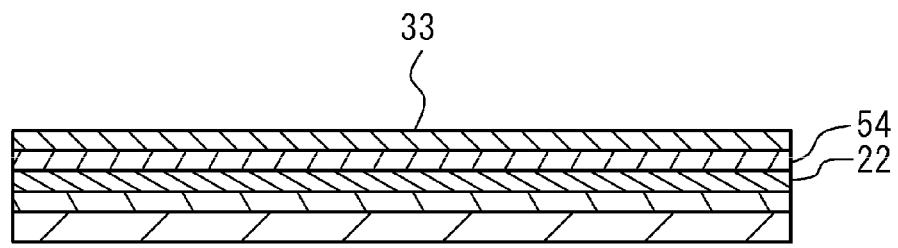
Figure 5D:
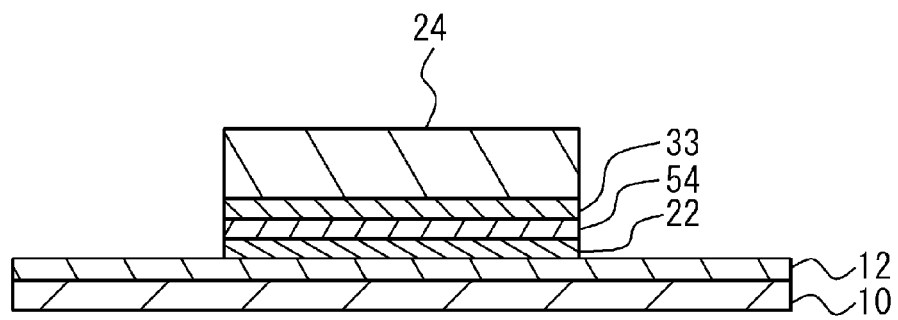

Next, the second silicon nitride film 33 is formed on the insulating film 54, as illustrated in FIG. 5C. The formation and the patterning of the first resist 24 is performed on the second silicon nitride film 33, as illustrated in FIG. 5D. Each of the second silicon nitride film 33, the insulating film 54, and the first silicon nitride film 22 is etched by using the first resist 24 as the mask, and the surface of the nitride semiconductor layer 12 is exposed. Here, since the second silicon nitride film 33 is different in specification of the film from the second silicon nitride film 31 of the first embodiment, a different reference numeral is used. Specifically, a condition of the first embodiment is that the second silicon nitride film 31 is a low density compared with the first silicon nitride film 22, and a condition of the second embodiment is that the second silicon nitride film 33 is a high density compared with the insulating film 54.

Figure 6A:
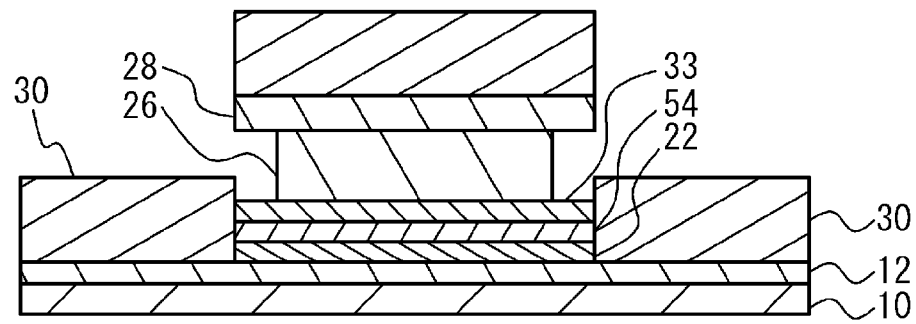
FIGS. 6A to 6C are diagrams illustrating the method for manufacturing the semiconductor device according to the second embodiment (part 2)
Figure 6B:
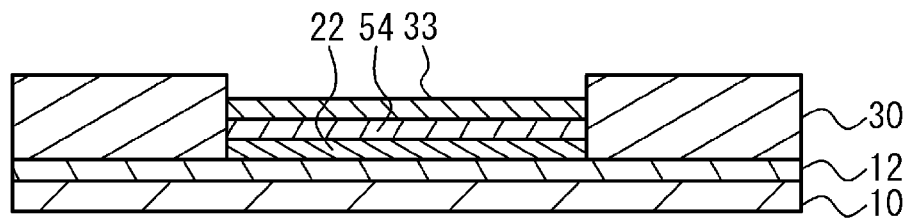

Next, the first resist 24 is exfoliated, and the formation and the patterning of the second resist 26 and the third resist 28 is performed, as illustrated in FIG. 6A. Then, the ohmic electrodes 30 are formed by using the second resist 26 and the third resist 28 as the mask. Liftoff of the second resist 26 and the third resist 28 is performed, and the annealing process of the ohmic electrodes 30 is performed, as illustrated in FIG. 6B.

Figure 6C:
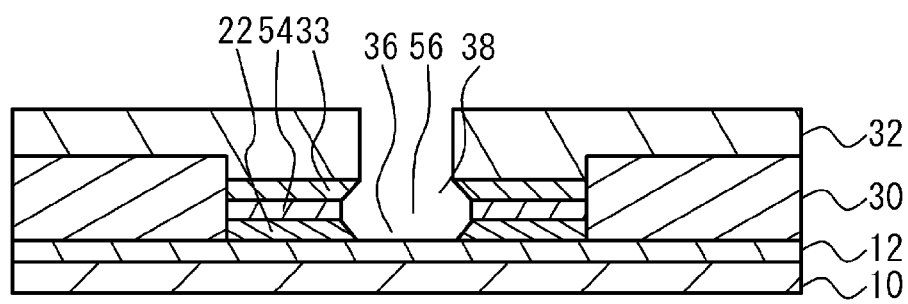

Next, the fourth resist 32 is formed on the second silicon nitride film 33 and the ohmic electrodes 30, as illustrated in FIG. 6C. The patterning is performed so as to be aligned with the formation position of the gate electrode. Then, each of the second silicon nitride film 33, the insulating film 54 and the first silicon nitride film 22 is etched by using the fourth resist 32 as the mask, and the surface of the nitride semiconductor layer 12 is exposed. By the above-mentioned process, the first opening 36, the second opening 38 and the third opening 56 are formed on the first silicon nitride film 22, the second silicon nitride film 33 and the insulating film 54, respectively. At this time, the first opening 36 becomes the taper shape which spreads from the side of the nitride semiconductor layer 12 toward the opposite side thereof. The second opening 38 becomes the inverse tapered shape which narrows from the side of the nitride semiconductor layer 12 toward the opposite side thereof. The dry etching by the reactive ion etching (RIE) system is employable as the above-mentioned etching process, for example. Specifically, $SF_6$ (a gas flow rate: 40 SCCM) and $CHF_3$ (a gas flow rate: 5 SCCM) can be used as etching gas, for example, and the pressure can be set to 2 Pa and the power can be set to 100 W.

Figure 7A:
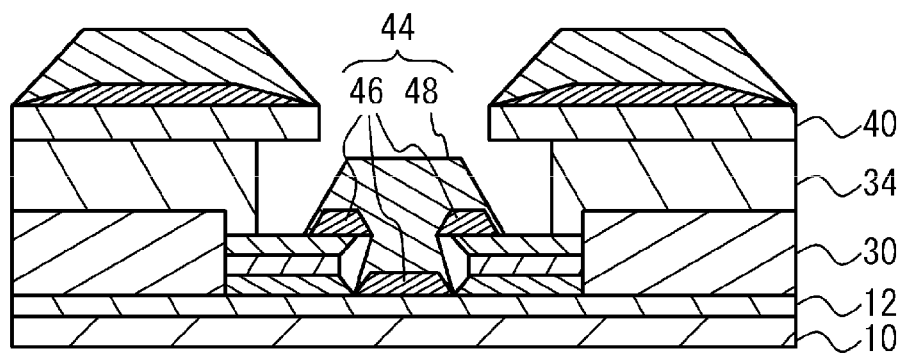
FIGS. 7A and 7B are diagrams illustrating the method for manufacturing the semiconductor device according to the second embodiment (part 3)

Next, the fourth resist 32 is exfoliated, as illustrated in FIG. 7A. Then, the fifth resist 34 and the sixth resist 40 are formed on the second silicon nitride film 33 and the ohmic electrodes 30. The patterning is performed so as to be aligned with the formation position of the gate electrode. At this time, the opening of the sixth resist 40 is made smaller than the opening of the fifth resist 34. Then, the gate electrode 44 is formed by using the fifth resist 34 and the sixth resist 40 as the mask. As is the case with the first embodiment, the gate electrode 44 is configured so that the second metal layer 48 having the low resistance is laminated on the first metal layers 46 which has the high resistance and becomes the base.

Figure 7B:
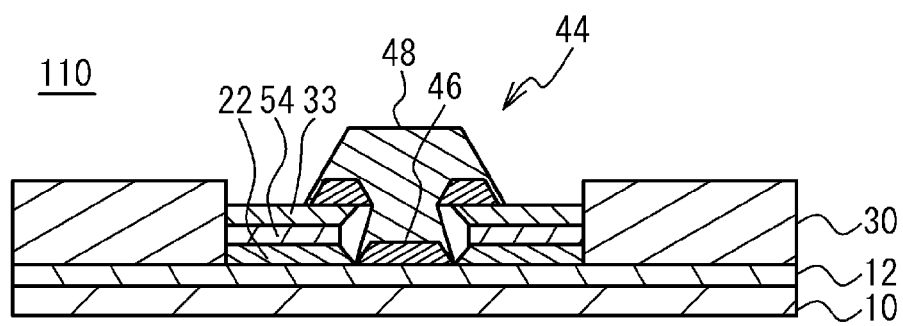

Next, the liftoff of the fifth resist 34 and the sixth resist 40 is performed, as illustrated in FIG. 7B. According to the above processes, a semiconductor device 110 according to the second embodiment is completed. In the semiconductor device 110, the nitride semiconductor layer 12 is formed on the substrate 10, and the ohmic electrodes 30 which are the source electrode and the drain electrode are directly formed on the nitride semiconductor layer 12. The insulating films (i.e., the first silicon nitride film 22, the insulating film 54 and the second silicon nitride film 33) of the three layers are formed in the opening between the ohmic electrodes 30. The gate electrode 44 is formed in the openings (i.e., the first opening 36, the second opening 38, and the third opening 56) formed on the insulating films. The gate electrode 44 comes in contact with the nitride semiconductor layer 12, and is formed so as to reach the surface of the second silicon nitride film 33 through the above-mentioned openings. In the present embodiment, the surface of the gate electrode 44 projects from the surface of the second silicon nitride film 33 and becomes a convex shape.

Figure 8:
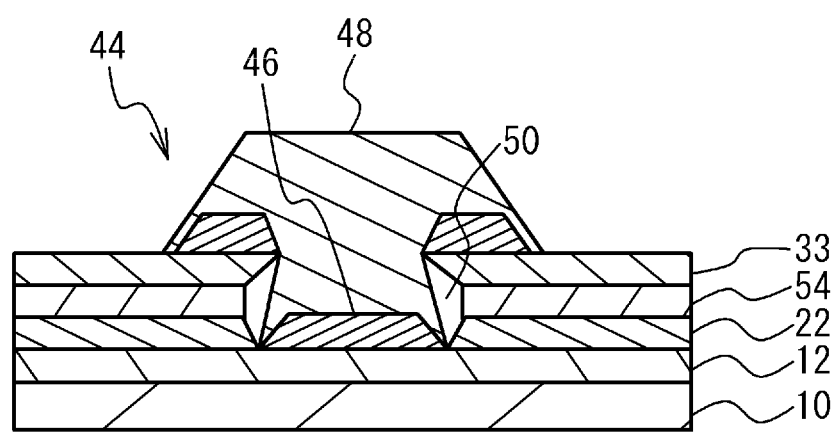
FIG. 8 is an enlarged view illustrating the configuration of a portion of a gate electrode.

FIG. 8 is a schematic cross-section diagram illustrating the detailed configuration of the gate electrode in the semiconductor device according to the second embodiment. As is the case with the first embodiment, the shape of the opening (i.e., the first opening 36) of the lower silicon nitride film (i.e., the first silicon nitride film 22) becomes the forward tapered shape, and the shape of the opening (i.e., the second opening 38) of the upper silicon nitride film (i.e., the second silicon nitride film 33) becomes the inverse tapered shape. Then, in the openings (i.e., the first opening 36, the second opening 38, and the third opening 56) of the respective insulating films, the gate electrode 44 separates from the side walls of the respective insulating films via the cavities 50. According to the present configuration, the contact between the gate electrode 44 and the insulating films is controlled in the openings (36, 38 and 56) of the insulating films (22, 33, 54) on the nitride semiconductor layer 12. Thereby, the decrease of the characteristic and the reliability of the HEMT can be controlled.

According to the semiconductor device 110 of the second embodiment, since the first opening 36 becomes the forward tapered shape, the gate electrode 44 can be formed so as to cover the surface of the nitride semiconductor layer 12. Thereby, the exposure of the nitride semiconductor layer 12 can be controlled, as is the case with the first embodiment.

Next, description will be given of the semiconductor device according to variation examples of the second embodiment.

Figure 9:
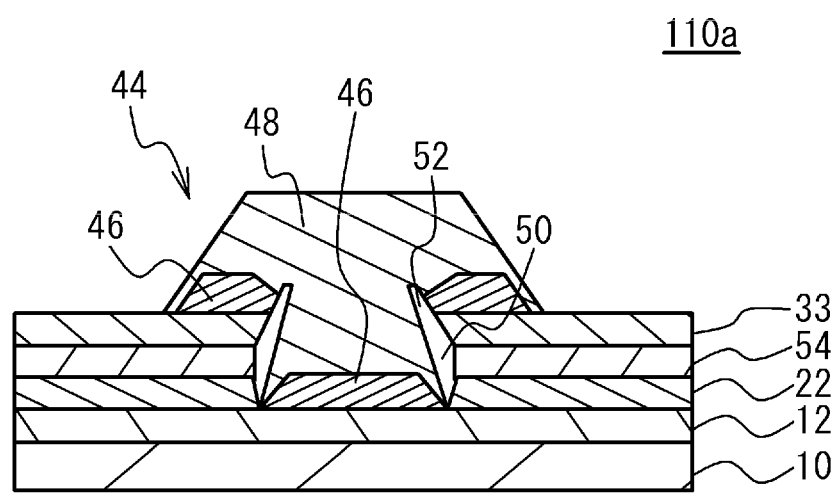
FIG. 9 is a diagram illustrating the configuration of the semiconductor device according to a first variation example of the second embodiment.

FIG. 9 is a diagram illustrating the configuration of a semiconductor device 110a according to a first variation example of the second embodiment. In the semiconductor device 110a, the cavities 50 between the gate electrode 44 and the side walls of the insulating films (22, 33, 54) extend or project above the second silicon nitride film 33, and parts of the first metal layers 46 on the second silicon nitride film 33 separate from the second metal layer 48. That is, parts of the first metal layers 46 on the second silicon nitride film 33 separate from the second metal layer 48 via the cavities 52, and the cavities 52 are continuous with the cavities 50 between the gate electrode 44 and the silicon nitride films (22 and 33). Thereby, the stress between the gate electrode 44 and the silicon nitride films (22 and 33) can be reduced, and the decrease of the characteristic and the reliability of the HEMT can further be controlled.

Although the insulating film (22, 33, 54) are etched by using isotropic dry etching in the second embodiment, anisotropic etching can also be used. Hereinafter, this point is explained.

Figure 10A:
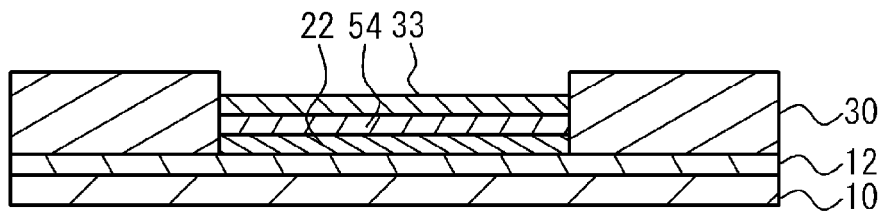
FIGS. 10A to 10D are diagrams illustrating the configuration of the semiconductor device according to a second variation example of the second embodiment.
Figure 10B:
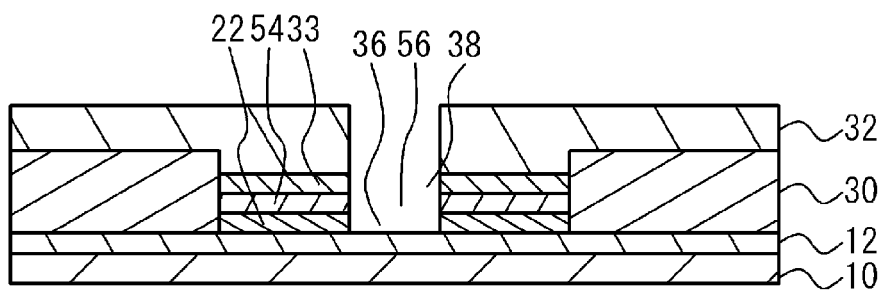

FIGS. 10A to 10D are schematic cross-section diagrams illustrating a method for manufacturing the semiconductor device according to a second variation example of the second embodiment. FIGS. 10A to 10D are replaced with the etching process of the insulating films (22, 33, 54) illustrated in FIGS. 6B and 6C. First, from a state indicated in FIG. 10A, the formation and the patterning of the fourth resist 32 are performed on the second silicon nitride film 33 and the ohmic electrodes 30, as illustrated in FIG. 10B. Then, each of the second silicon nitride film 33, the insulating film 54, and the first silicon nitride film 22 is etched by using the fourth resist 32 as the mask, and the surface of the nitride semiconductor layer 12 is exposed. By the above-mentioned process, the first opening 36, the second opening 38 and the third opening 56 are formed on the first silicon nitride film 22, the second silicon nitride film 33 and the insulating film 54, respectively. At this time, the first opening 36, the second opening 38 and the third opening 56 become all the same shape, and the side walls of the openings become perpendicular. The dry etching by the inductively coupled plasma (ICP) system can be employed as the above-mentioned etching process, for example. Specifically, $SF_6$ (the gas flow rate: 40 SCCM) and $CHF_3$ (the gas flow rate: 5 SCCM) can be used as etching gas, for example, the pressure can be set to 0.5 Pa, an antenna power can be set to 100 W, and a bias power can be set to 10 W.

Figure 10C:
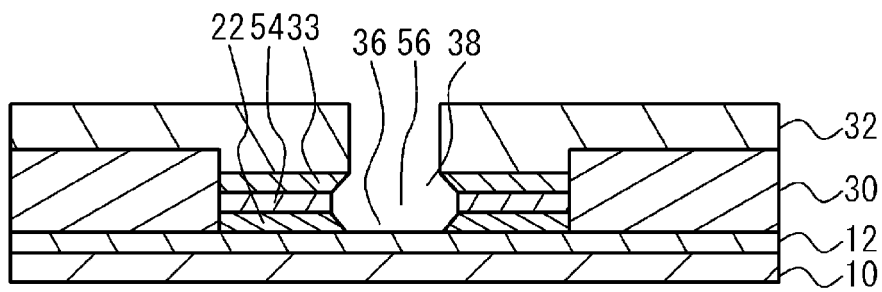

Next, the etching is further performed on the first opening 36, the second opening 38 and the third opening 56, as illustrated in FIG. 10C. The first opening 36 is made into the forward tapered shape, and the second opening 38 is made into the inverse tapered shape. The above-mentioned etching process can be performed by the wet etching, for example. Specifically, the etching is performed for 30 seconds by using ammonium fluoride as an etchant, for example. At this time, the material of the insulating film 54 is selected beforehand so that the etching rate of the insulating film 54 becomes larger than the etching rates of the first silicon nitride film 22 and the second silicon nitride film 33. For example, the above-mentioned conditions (etching rate: $SiN<SiO_2$) can be attained by using $SiO_2$ as the insulating film 54.

Figure 10D:
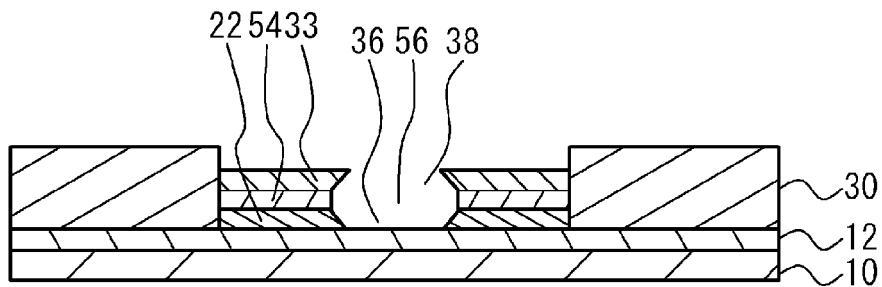

Next, the fourth resist 32 is exfoliated, as illustrate in FIG. 10D. Then, the gate electrode 44 is formed in the same manner as the processes after FIG. 7A of the second embodiment. As described above, the method according to the second variation example can also form the openings having the same shape as those of the second embodiment.

In the second embodiment, the insulating film 54 having the low density and the low refractive index is put between the first silicon nitride film 22 and the second silicon nitride film 33 which have the high density and the high refractive index. Thereby, as the shapes of the openings at the time of the etching, the lower layer (i.e., the first silicon nitride film 22) can be made into the forward tapered shape, and the upper layer (i.e., the second silicon nitride film 33) can be made into the inverse tapered shape. As a method to change the density and the refractive index, there is a method to perform heat treatment on the silicon nitride film as described above. In addition, by changing film forming conditions variously, the densities and the refractive indexes of the silicon nitride film and the insulating film can be changed.

Here, when the refractive index of the silicon nitride film becomes large, the silicon composition ratio of the silicon nitride film becomes large. The composition ratio Si/N of the silicon nitride film whose refractive index is 1.8 to 2.1 becomes a stoichiometrical value 0.75. However, the silicon nitride film whose refractive index is equal to or more than 2.2 becomes a film (silicon Rich film) including silicon excessively and becomes high density. Therefore, it is desirable that the refractive indexes of the first silicon nitride film 22 and the second silicon nitride film 33 which become high refractive indexes in the second embodiment are 2.3 or more, and it is more desirable that the refractive indexes are 2.35 or more. It is desirable that the refractive indexes of the first silicon nitride film 22 and the second silicon nitride film 33 are below a level in which they do not become an amorphous state. For example, it is desirable that the refractive indexes of the first silicon nitride film 22 and the second silicon nitride film 33 are 2.85 or less, and it is more desirable that the refractive indexes of the first silicon nitride film 22 and the second silicon nitride film 33 are 2.6 or less. On the other hand, it is desirable that the refractive index of the insulating film 54 which becomes the low refractive index is stoichiometrical composition. For example, it is desirable that the refractive index of the insulating film 54 is equal to or more than 1.8 and equal to or less than 2.1. It is more desirable that the refractive index of the insulating film 54 is equal to or more than 1.85 and equal to or less than 2.05.

The silicon nitride films 22 and 33 having the high refractive index according to the second embodiment can be generated according to the following film forming conditions, for example:

film forming apparatus: parallel-plate plasma CVD apparatus;

substrate temperature: 250-350° C.;

film forming gas: $SiH_4$, $N_2$, He, $NH_3$;

gas flow rate: SiH$_4$: 3-6 sccm; N$_2$: 200-600 sccm, He: 500-900 sccm; NH$_3$: 0-8 sccm;
  pressure: 0.8-1.0 Torr; and
  power: 25-75 watts.

The insulating film 54 having the low refractive index can be generated according to the following film forming conditions, for example:
  film forming apparatus: parallel-plate plasma CVD apparatus;
  substrate temperature: 250-350° C.;
  film forming gas: SiH$_4$, N$_2$, He, NH$_3$;
  gas flow rate: SiH$_4$: 1-4 sccm; N$_2$: 200-600 sccm, He: 900-1100 sccm; NH$_3$: 4-10 sccm;
  pressure: 0.8-1.0 Torr; and
  power: 25-75 watts.

Although SiC is used as the substrate 10 in the first and the second embodiments, Si, GaN, sapphire and the like can be used. Moreover, although GaN, AlGaN and the like are used as the nitride semiconductor layer 12, InN, AlN, AlInN, InGaN, AlInGaN and the like can be used.

Although the embodiments of the present invention are described in detail, the present invention is not limited to the specifically described embodiments, but includes other embodiments and variations within the scope of the claimed invention.

What is claimed is:

1. A semiconductor device, comprising:
  a nitride semiconductor layer;
  a first silicon nitride film that is formed on the nitride semiconductor layer, has a first opening whose inner wall is a forward tapered shape;
  a second silicon nitride film that is formed on the first silicon nitride film, and has a second opening whose inner wall is an inverse tapered shape; and
  a gate electrode formed on the nitride semiconductor layer exposed in the first opening;
  wherein a side wall of the gate electrode separates from the first silicon nitride film and the second silicon nitride film via a cavity.

2. The semiconductor device according to claim 1, further comprising:
  an insulating film that is interposed between the first silicon nitride film and the second silicon nitride film, and has a third opening;
  wherein the side wall of the gate electrode separates from an inner wall of the third opening via the cavity.

3. The semiconductor device according to claim 1, wherein the gate electrode is formed in contact with the inner wall of a lower side of the first silicon nitride film.

4. The semiconductor device according to claim 1, wherein the gate electrode includes first metal layers, and a second metal layer that is formed on the first metal layers, and
  one of the first metal layers is formed on the second silicon nitride film, and separates from another one of the first metal layers formed on the nitride semiconductor layer.

5. The semiconductor device according to claim 2, wherein the insulating film is any one of silicon nitride and silicon oxide.

6. The semiconductor device according to claim 4, wherein each of the first metal layers includes nickel and the second metal layer includes gold.

7. The semiconductor device according to claim 4, wherein adhesiveness between each of the first metal layers and the second silicon nitride film is greater than adhesiveness between the second metal layer and the second silicon nitride film.

8. The semiconductor device according to claim 4, wherein each of the first metal layers is composed of nickel, and palladium formed thereon.

9. The semiconductor device according to claim 2, wherein refractive indexes of the first silicon nitride film and the second silicon nitride film are 2.3 or more and 2.85 or less, and a refractive index of insulating film is 1.8 or more and 2.1 or less.

10. The semiconductor device according to claim 4, wherein the cavity projects above the second silicon nitride film, parts of the first metal layers on the second silicon nitride film separate from the second metal layer via the cavity.

11. A method for manufacturing a semiconductor device, comprising:
  forming a first silicon nitride film on a nitride semiconductor layer;
  forming a second silicon nitride film on the first silicon nitride film having an etching rate larger than that of the first silicon nitride film;
  etching the first silicon nitride film and the second silicon nitride film, and forming a first opening and a second opening on the first silicon nitride film and the second silicon nitride film, respectively;
  forming a gate electrode in the first opening and the second opening formed on the nitride semiconductor layer;
  wherein in the forming the gate electrode, the gate electrode covers the nitride semiconductor layer exposed in the first opening, and is formed so that a side wall of the gate electrode separates from the first silicon nitride film and the second silicon nitride film via a cavity.

12. The method for manufacturing the semiconductor device according to claim 11, wherein the forming the first silicon nitride film includes making the etching rate of the first silicon nitride film smaller than the etching rate of the second silicon nitride film, by performing heat treatment on the first silicon nitride film.

13. The method for manufacturing the semiconductor device according to claim 11, further comprising:
  forming an insulating film between the first silicon nitride film and the second silicon nitride film, the insulating film having a third opening;
  wherein the side wall of the gate electrode separates from an inner wall of the third opening via the cavity, and the etching rate of the insulating film is larger than the etching rate of the second silicon nitride film.

14. The method for manufacturing the semiconductor device according to claim 11, wherein the etching the first silicon nitride film and the second silicon nitride film includes forming the first opening which has a forward tapered shape with respect to the nitride semiconductor layer, in the first silicon nitride film, and forming the second opening which has an inverse tapered shape with respect to the nitride semiconductor layer, in the second silicon nitride film.

15. The method for manufacturing the semiconductor device according to claim 11, wherein the gate electrode includes first metal layers, and a second metal layer that is formed on the first metal layers, and
  one of the first metal layers is formed on the second silicon nitride film, and separates from another one of the first metal layers formed on the nitride semiconductor layer.

16. The method for manufacturing the semiconductor device according to claim 11, wherein the cavity projects above the second silicon nitride film, parts of the first metal layers on the second silicon nitride film separate from the second metal layer via the cavity.

17. The method for manufacturing the semiconductor device according to claim 11, wherein the etching of the first silicon nitride film and the second silicon nitride film is performed with at least one etching gas of $SF_6$, $CHF_3$ and $CH_4$, according to a reactive ion etching (RIE) system or an inductively coupled plasma (ICP) system.

18. The method for manufacturing the semiconductor device according to claim 12, wherein the temperature of the heat treatment is from 400 to 600° C.

19. The method for manufacturing the semiconductor device according to claim 13, wherein the insulating film is any one of silicon nitride and silicon oxide.

* * * * *